United States Patent [19]

Beutler et al.

[11] Patent Number: 5,537,042
[45] Date of Patent: Jul. 16, 1996

[54] METHOD AND SYSTEM FOR UNOBTRUSIVELY MEASURING PHYSICAL PROPERTIES IN ELECTROCHEMICAL PROCESSES

[75] Inventors: Jon F. Beutler, Arlington; Bernard J. Burreson, Seattle; Walter A. Van Schalkwijk, Blaine; Delbert F. Flagg, Jr., Redmond; Gregory A. Kromholtz, Seattle; Jeffrey J. Green, Lake Stevens, all of Wash.

[73] Assignee: ELDEC Corporation, Lynnwood, Wash.

[21] Appl. No.: 342,385

[22] Filed: Nov. 18, 1994

[51] Int. Cl.⁶ .................................................. G01N 27/416
[52] U.S. Cl. .................. 324/432; 324/426; 324/427; 324/437; 324/654; 324/234; 429/10; 429/91; 429/93
[58] Field of Search .................................. 324/426, 427, 324/432, 436, 437, 654, 226, 234, 236; 340/636; 429/10, 91, 93

[56] References Cited

U.S. PATENT DOCUMENTS

| | | | |
|---|---|---|---|
| 3,153,190 | 10/1964 | Spalding | 324/20 |
| 3,230,447 | 1/1966 | Cann | 324/34 |
| 3,680,072 | 7/1972 | Charbonnier et al. | 340/249 |
| 4,048,556 | 9/1977 | Roach et al. | 324/40 |
| 4,352,067 | 9/1982 | Ottone | 324/434 |
| 4,451,894 | 5/1984 | Dougherty et al. | 364/509 |
| 4,577,145 | 3/1986 | Mullersman | 429/10 X |
| 4,647,854 | 3/1987 | Yamada et al. | 324/207 |
| 4,719,427 | 1/1988 | Morishita et al. | 324/430 |
| 4,743,855 | 5/1988 | Randin et al. | 324/430 |
| 4,799,047 | 1/1989 | Saitoh | 340/618 |
| 4,833,459 | 5/1989 | Geuer et al. | 340/636 |
| 4,859,940 | 8/1989 | Hummert et al. | 324/204 |
| 5,061,364 | 10/1991 | Metala et al. | 210/85 |
| 5,093,624 | 3/1992 | Stevenson | 324/426 |
| 5,132,626 | 7/1992 | Limuti et al. | 324/432 |
| 5,250,903 | 10/1993 | Limuti et al. | 324/427 |
| 5,336,997 | 8/1994 | Anim-Appiah et al. | 324/207.16 |

OTHER PUBLICATIONS

Churchill, T. L. et al., "Comprehensive Noninvasive Battery Monitoring of Lead-Acid Storage Cells in Unattended Locations", *IEEE*, 1994 (no month), vol. 20-1, pp. 594–601.

Churchill, T. L., et al. "Non-Invasive Lead-Acid Battery Monitoring", Paper presented to, and published in the proceedings of, The Seventh International Power quality Conference, Dallas, Texas, Sep. 17–22, 1994.

Churchill, T. L., "Functionality and Status of the MCM/EPRI Lead-Acid Storage-Cell Battery-Bank Condition-Monitoring system," Presentation made to The IEEE Battery Working Group for Battery Testing Standards, Chicago, Illinois, Sep. 28, 1994.

Award by R & D Magazine recognizing the Lead-Acid Wet-Cell, Battery Monitoring System as "One of the 100 Most Technologically Significant New Products in the World in 1993," presented to MCM Enterprise Ltd., Chicago, IL, Sep. 22, 1994.

*Primary Examiner*—Kenneth A. Wieder
*Assistant Examiner*—Glenn W. Brown
*Attorney, Agent, or Firm*—Christensen O'Connor Johnson & Kindness

[57] ABSTRACT

Disclosed is a method and system for unobtrusively measuring physical properties in electrochemical processes occurring in a predefined volume, such as the state of charge in an electrochemical battery. The invention provides for a coil (22) or (42) positioned relative to the predefined volume to minimize the reluctance path between the coil and the electrochemical process, with the winding axis of the coil generally transverse to a surface bounding the predefined volume. In this position, an alternating current is applied to the coil to generate an oscillatory magnetic field. Preferably, the coil includes a core (24) or a backing plate (46) for concentrating the magnetic field in a direction towards the process in the predefined volume. The physical properties are determined based upon a measurement of the electrical complex impedance of the coil, and data correlating the physical properties of the process with the electrical complex impedance of the coil.

21 Claims, 14 Drawing Sheets

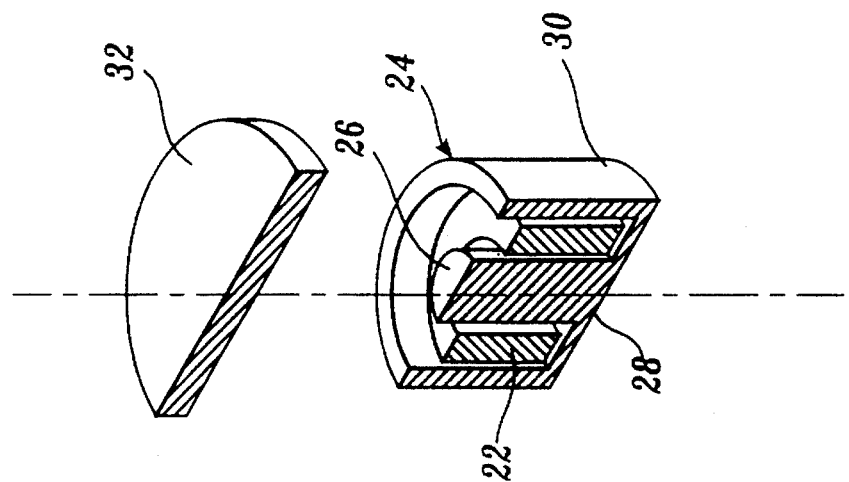
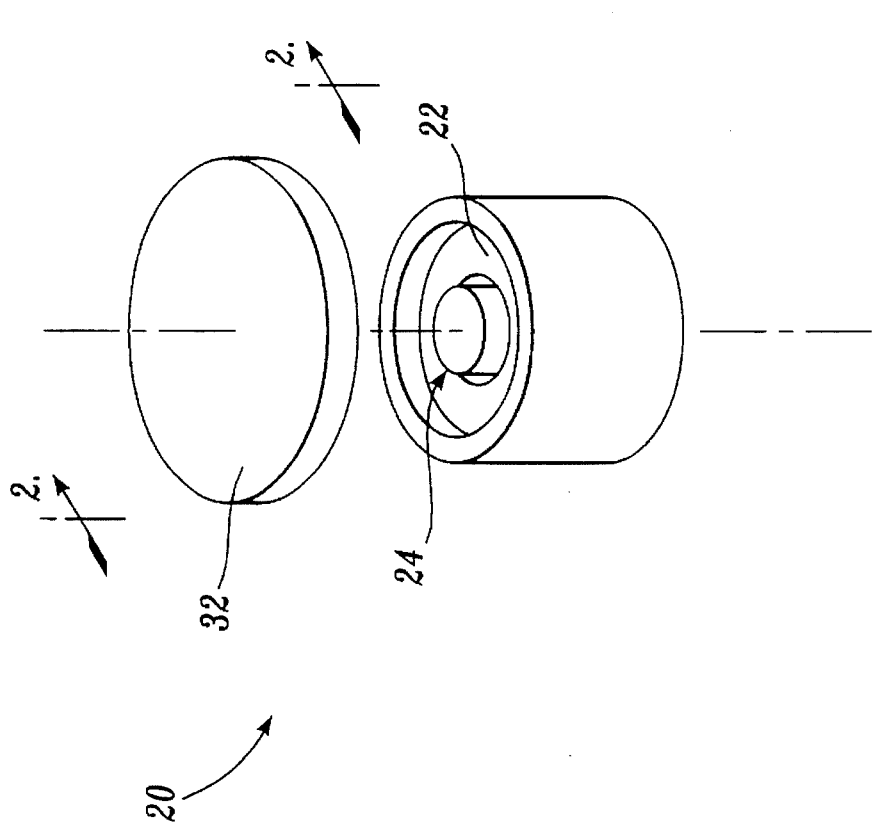
Fig. 2.
Fig. 1.

METHOD AND SYSTEM FOR UNOBTRUSIVELY MEASURING PHYSICAL PROPERTIES IN ELECTROCHEMICAL PROCESSES

FIELD OF THE INVENTION

The present invention relates to unobtrusive sensing systems and methods, and more particularly to unobtrusive sensing systems and methods for measuring physical properties in electrochemical processes, such as batteries.

BACKGROUND OF THE INVENTION

Electrochemical processes are used in a variety of applications from manufacturing and plating processes to electrochemical storage cells. Common to all of these processes is the conversion of chemical energy to electrical energy or electrical energy to chemical energy. During this conversion process, the materials involved change their physical properties.

All electrochemical cells share some common characteristics. A positive (+) electrode, or anode, is separated from the negative (+) electrode, or cathode, by a chemically inert separator that is capable of electrolytic conduction. In most battery systems the electrolyte is a liquid that consists of a salt or an acid that is dissolved in either water or an organic solvent. The electrolyte is usually a liquid which is added to the cell near the end of the manufacturing process. For some process systems the electrolyte may be a gel or a conductive solid (which may also act as the separator) which is more easily incorporated into the manufacturing process. The anode is where electrochemical reduction occurs during discharge. The cathode is where electrochemical oxidation occurs during discharge. Cathode and anode pairs can be combined in an electrochemical cell to increase the capacity and/or current capability of the system. Combinations of cells can be made to increase the voltage of a system. Such a combination is referred to as a battery.

Accurate knowledge of the state of charge of a cell or battery is often important for efficient and prolonged operation of the cell or battery. The increased use of secondary batteries as the main power source in many applications frequently makes knowledge of battery state of charge critical. Notwithstanding, the state of charge is a physical property that is not readily measurable. Consequently, several solutions have been proposed over the years for monitoring and measuring the state of charge in electrochemical storage batteries.

Most of these solutions predict the state of charge based upon measurements of battery voltage or current. However, the state of charge depends upon the extent to which an electrochemical reaction has occurred in a battery. Voltage or current measurements are an indirect and imprecise measure of the extent of the electrochemical reaction. Further, differences in the battery chemistry, even for the same battery type, manufacturing method, intended use, and use profile limit the usefulness of voltage and current measurements. Listed below is a brief explanation of the most widely used solutions for measuring state of charge.

The simplest and least satisfactory solution for measuring state of charge is simply to use the battery until the battery can no longer perform satisfactorily for its intended use. For rechargeable batteries, when this condition is met, the battery is charged for a predetermined period of time, and used again.

Another solution monitors the battery voltage. When the voltage falls below a predetermined value, a warning indicates the end of the discharge cycle so a system powered by the battery can be safely shut down. The battery is then charged for predetermined period of time and used again.

Other solutions provide a predetermined charge algorithm that is repeated each time a battery is charged. Most of these solutions, though, assume the battery is at a certain discharge state, regardless of the actual state of charge of the battery. More particularly, the charging algorithm does not distinguish between a battery that is fully discharged, and a battery that is only partly discharged.

In yet other solutions incorporating a charge algorithm, attempts are made to determine the battery state of charge by measuring battery temperature, voltage, and perhaps other properties. Based on this information, the battery state of charge is estimated by the charge algorithm.

Solutions involving flooded lead-acid batteries rely upon measuring the specific gravity of the battery electrolyte and temperature to determine the state of charge. This can be an accurate determination because it directly measures the extent of the electrochemical reaction in the battery, but is inconvenient and is best done in a static environment when the battery is not in use.

Solutions involving sealed lead-acid, alkaline (NiCd, NiFe, NiZn and NiMH), and lithium-ion systems rely on "across the terminal" measurements of battery voltage or battery impedance under various conditions to approximate the state of charge. Some of these solutions employ both measurements as a corroborative measure of the battery state of charge. Measurements across the terminals of a battery vary according to the chemistry of the battery. Even identical battery chemistries have different measurement parameters for different battery configurations. For example, with nickel-cadmium batteries the behavior of sealed and vented cells differs because of the limited amount of electrolyte in the sealed cells. There are also differences that depend on whether the cell is designed for high capacity (dense electrodes) or high current capability (higher porosity electrodes). Even when cells are supposed to be identical, the statistical differences in manufacture will limit the effectiveness of across the terminal measurements.

In other solutions, battery current is monitored to estimate the amount of charge applied or drawn from a battery. These types of solutions are limited in that they do not account for several factors, such as: the limited efficiency inherent in battery reactions; parasitic reactions involving gas generation during charge; or parasitic reactions involving discharge of the electrode substrates during over discharge. These factors not only affect the initial accuracy of this approach, but also may vary substantially over time and battery usage. Therefore, these solutions require correction algorithms to account for the inaccuracies caused by variations in the noted factors. In lab environments these solutions can accurately determine the state of charge of a battery. However, in actual applications, the correction algorithms are virtually impossible to predict.

One proposed solution to the problem of measuring battery state of charge is disclosed in U.S. Pat. Nos. 5,132, 626 and 5,250,903 to Limuti et at. These patents disclose a coil encircling a battery or cell, with the central axis of the coil being in a plane that is parallel to the planes of the battery plates (anodes and cathodes). The coil induces voltage on the battery plates that cause eddy currents to circulate in a manner similar to the flow of currents in a standard laminated 'C' or 'E' core transformer. According to the patents, the state of charge in flooded lead acid storage batteries is measured by sensing the available "metallic volume" of the battery. The coil, however, is not protected with shielding from electromagnetic interference ("EMI"), nor is there any attempt to prevent the coil from detecting any surrounding conductive or permeable materials. Further, the magnetic flux generated by the coil does not impinge on the plates in an optimal direction. In addition, there is no possibility of isolating the response of one plate of the battery from the response of another plate.

The susceptibility of the coil to EMI interference means that the solution for measuring state of charge proposed in these patents is not capable of consistent performance in most practical applications. An attempt was made to use the solution disclosed in these patents in a laboratory to determine the state of charge of a battery. Extremely poor signal conditions were observed. Measurements consisted mostly of noise, with a small, almost unusable, signal response. The poor laboratory results suggests that it would be impractical to use this solution in typical applications in which electrical noise, thermal, or mechanical variances would contribute significant measurement errors.

Another solution is proposed in U.S. Pat. No. 5,093,624 to Stevenson. This patent discloses placing a coil adjacent the side of a lead-acid battery that is nearest the negative plate of the battery. An alternating voltage is then applied to the coil, which the patent asserts causes an eddy current to circulate on the negative plate of the battery. According to the patent, the alternating current in the coil increases as the battery charges, to a maximum, and then begins to decrease. Thus, the alternating current in the coil is monitored to determine the state of charge of the battery.

However, there is no attempt to protect the coil from EMI, or to prevent the coil from detecting surrounding conductive or permeable materials. Hence, this is also an impractical solution.

The problems associated with electronic interference from external sources (EMI), electronic radiation from the sensing coil causing interference and compatibility problems with other equipment (EMC), sensor temperature stability, adjacent material sensing interference, signal-to-noise ratio optimization, as well as sensing parameter optimization, appear to all have been ignored in existing patents. Accordingly, the present invention provides an improved solution to the problem of measuring the state of charge of a battery or other electrochemical system.

SUMMARY OF THE INVENTION

The invention provides a method and system for unobtrusively measuring physical properties in electrochemical processes, such as the state of charge in an electrochemical battery. Typically, in an electrochemical battery, the battery includes an anode having a first sheet of material, and a cathode having a second sheet of material. With specific regard to measuring the state of charge in such a battery, the invention includes a coil that is positioned relative to the battery to minimize the reluctance path between the coil and a selected sheet of the battery.

In this position, the coil is oriented so that the winding axis of the coil is generally transverse to the surface of the selected sheet, and an alternating current of a first frequency is applied to the coil to generate an oscillatory magnetic field. Preferably, the coil includes a magnetically permeable core, having at least a portion of the coil encircled by the core for concentrating the magnetic field in a direction towards the selected sheet. Alternatively, the coil may include a backing plate formed of a magnetically permeable material which is electrically nonconductive or poorly conductive. The backing plate is positioned adjacent the coil, opposite the battery, for concentrating the magnetic field in a direction towards the selected sheet.

The electrical complex impedance of the coil at the first frequency is then measured. The state of charge of the battery is determined by comparing the measured electrical complex impedance of the coil with data correlating the state of charge of the battery with the electrical complex impedance of the coil.

The frequency of the alternating current may be selected to maximize the effect that the selected sheet has on the electrical impedance of the coil. More particularly, if the selected sheet is shielded by another sheet, lower frequencies are preferred to achieve a greater depth of penetration of the magnetic field into the battery.

In other aspects of the invention, the state of charge of the battery is determined by reducing the measured electrical complex impedance of the coil into first and second components. A first initial determination of the state of charge of the battery is made based upon the first component, and a second initial determination is made based on the second component. A final determination of the state of charge of the battery is then made based on the first and second initial determinations.

In yet other aspects of the invention, the coil and at least one chosen sheet of the battery are mathematically modeled based upon electrical equivalents. Then an alternating current at a plurality of frequencies is applied to the coil to generate a plurality of oscillatory magnetic fields, and the electrical complex impedance of the coil is measured at the plurality of frequencies. Using the mathematical model of the coil and the chosen sheet, and the measured electrical complex impedance of the coil at the plurality of frequencies, the permeability and conductivity of the chosen sheet are determined. Potentially confounding error sources in the measurement are reduced or eliminated as well. Based upon the permeability and conductivity of the chosen sheet, the state of charge of the battery is determined.

More generally, the invention provides for measuring a physical parameter of a chemical solution or an electrochemical process occurring in a predefined volume using a coil. The coil is positioned relative to the predefined volume to minimize the reluctance path between the coil and the chemical solution or process, with the winding axis of the coil generally transverse to a surface bounding the predefined volume.

In this position, an alternating current is applied to the coil to generate an oscillatory magnetic field. Preferably, the coil includes a core for concentrating the magnetic field in a direction towards the solution or process in the predefined volume. The physical parameter is determined based upon a measurement of the electrical complex impedance of the coil, and data correlating the physical parameter of the chemical solution or process with the electrical complex impedance of the coil.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein:

FIG. 1 is a perspective view of a coil arrangement in accordance with the present invention;

FIG. 2 is a perspective, cross-sectional view of the coil arrangement of FIG. 1, along section line 2—2;

DETAILED DESCRIPTION OF THE PREFERRED EMBODIMENTS

Figure 3:
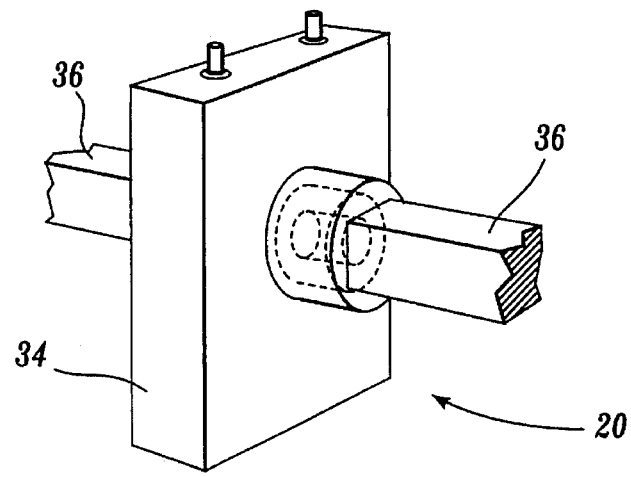
FIG. 3 is a perspective view of the coil arrangement of FIG. 1 mounted to a battery in an orientation in accordance with the present invention.

A system and method and for unobtrusively measuring physical properties in electrochemical processes in accordance with the present invention includes a coil arrangement 20 as shown in FIG. 1. Coil arrangement 20 includes a coil 22 having a core 24. Preferably, the core 24 is a conventional type known as a "pot" core. As illustrated in the cross section of coil arrangement 20 in FIG. 2, core 24 includes a central nose portion 26 axially projecting from a base portion 28 of the core. Walls 30 of core 24 project from around the periphery of base portion 28, such that a space is defined between the interior of walls 30 and the exterior of nose portion 26. Coil 22 is received in the space between nose portion 26 and walls 30, such that the walls encircle the coil, and the coil encircles the nose portion. A pair of leads (not shown) extend from coil 22 for applying an alternating electrical voltage to the coil.

When an alternating current is circulated through coil 22, core 24 shapes the resulting magnetic field such that the flux density of the field surrounding coil arrangement 20 is greatest in the area ahead of nose portion 26, in the direction towards target plate 32. Target plate 32 represents an item, such as a plate of a battery, or electrolyte, about which information is desired. The space between target plate 32 and coil arrangement 20 represents the reluctance path, such as a battery casing, or air, that the magnetic field extends across to encompass target plate 32. The purpose of concentrating the magnetic field flux density in the direction towards target plate 32 is so that the magnetic field generated by coil arrangement 20 will be affected substantially only by the target plate, and not by other objects, or sources of measurement interference or noise.

Coil arrangement 20 is used to sense the conductivity and/or permeability of a target plate within a battery 34, by placing the coil arrangement adjacent the battery as shown in FIG. 3. Preferably, coil arrangement 20 is oriented so as to minimize the reluctance path between the coil arrangement and the target plate, and maximize the effect the target plate has on the magnetic field generated by the coil arrangement. Thus, coil arrangement 20 is placed adjacent the side of battery 34 in which the target plate is closest to, with the winding axis of coil 22 generally perpendicular to the major surface area of the target plate. Hence, if the target plate was a battery plate located on the right side of battery 34, coil arrangement 20 would be placed adjacent the right side of the battery, with the winding axis of coil 22 generally perpendicular to the surface of the plate. Further, preferably, the winding axis of coil 22 would be more or less aligned with the central axis of the battery plate, to maximize the effect the plate has on the magnetic field generated by the coil, and to minimize the effect of other objects or sources of EMI on the magnetic field.

Coil arrangement 20 may be held in place by a clamp 36 that presses against the rear of the coil arrangement, and the opposite side of the battery 34. Alternatively, the casing of the battery may be manufactured with a space (not shown) for receiving a coil arrangement.

The signal-to-noise ratio of a coil arrangement in accordance with the present invention is almost always improved by increasing the physical dimensions of the arrangement. However, this is not the only criterion for optimizing the sensitivity of the arrangement to the target plate. Generally, it is desired to decrease the reluctance path between the coil arrangement and the target plate, while maintaining or decreasing other noises due to the core materials or external interferences. One way of accomplishing this in accordance with the present invention is to maximize the size of the coil arrangement, while not exceeding the target plate dimensions. Also, the physical width of the walls of a pot core, the size of the central nose portion, the selection of materials, and coil shape all take part in optimizing the signal-to-noise ratio of the coil arrangement.

Figure 4:
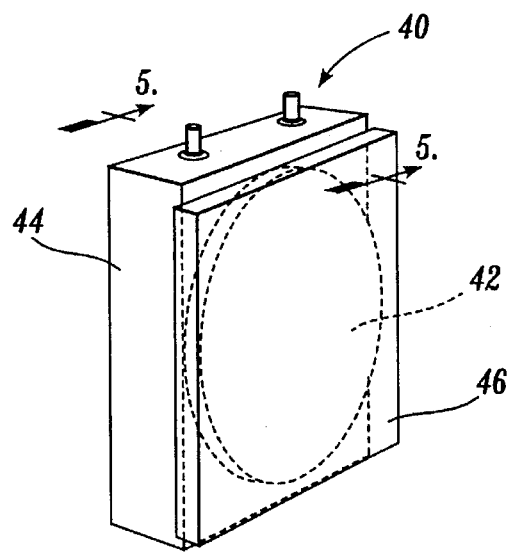
FIG. 4 is a perspective view of another coil arrangement in accordance with the present invention shown mounted to a battery.

Thus, another coil arrangement suitable for practicing the present invention but at lower cost is large coil arrangement 40, shown adjacent a battery 44 in FIG. 4. Large coil arrangement 40 is used in the same manner as previously described coil arrangement 20. However, large coil arrangement 40 includes a coil 42 having a diameter that is almost as large as the width of battery 44. The large diameter of coil 42 increases the sensitivity of coil arrangement 40 when used to measure state of charge within a battery. Preferably the diameter of coil 42 does not extend beyond the side of battery 44, so that substantially only the battery will affect the magnetic field generated by the coil. Further, if coil arrangement 40 is being used to detect physical properties of one or more plates within the battery, then preferably the diameter of coil 42 does not extend beyond an edge of the plate or plates.

Coil arrangement 40 includes a backing plate 46, rather than a core shape. Preferably, backing plate 46 comprises a highly permeable magnetic material which is nonconductive or poorly conductive, such as iron, steel, nickel, or ferrite type materials. Using low conductive permeable materials minimizes losses due to eddy currents in the backing plate when an alternating current is circulated through coil 42. Coil arrangement 40, like coil arrangement 20 should be made as wide as possible to improve the signal-to-noise ratio of the arrangement. The purpose of the backing plate is to shape a magnetic field generated by coil 42 such that the flux density of the field surrounding coil arrangement 40 is greatest in the area opposite the backing plate 46.

Figure 5:
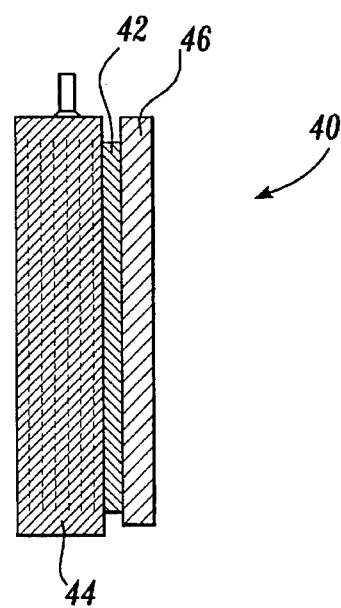
FIG. 5 is a cross-sectional view of the coil arrangement and battery of FIG. 4 along section line 5–5.

As with the previously described coil arrangement, coil arrangement 40 is used to sense the conductivity and/or permeability of a target plate within a battery, by placing the coil arrangement adjacent the battery. Thus, coil arrangement 40 is oriented so as to minimize the reluctance path between the coil arrangement and the target plate, and maximize the effect the target plate has on the magnetic field generated by the coil arrangement. Specifically, coil arrangement 40 is placed adjacent the side of battery 44 closest to the target plate with the winding axis of coil 42 generally perpendicular to the major surface area of the target plate. As shown in FIG. 5, coil arrangement 40 is clamped to the side of battery 44.

In alternate embodiments, coil arrangements may be used that have concave shaped coils, cores, and/or backing plates to correspond to a battery having a curved outer surface. Further, other types of cores or backing plates can be providing for concentrating the magnetic field of a coil in the direction towards a target plate. For example, coil 22 could simply have an elongated core disposed at the winding axis of the coil, rather than a pot core. Coil 42 could be provided with an elongated core in place of, or in addition to backing plate 46. Additionally, walls could be extended from the periphery of backing plate 46 to surround coil 42, or coil 42 could be provided with a pot core, rather than a backing plate 46.

When an alternating current ("AC") is applied to the coil arrangements described above, the current in the coils generates an oscillating magnetic field. The oscillating magnetic field results in a voltage in the space encompassed by the magnetic field, which is proportional to the derivative in flux density of the magnetic field with respect to time. If the space encompassed by the magnetic field is occupied by a nonconductive permeable material, the flux density of the coil arrangement is increased by the decreased reluctance of that space causing an effective increase in the measured inductance at the coil terminals.

If the space is occupied by a nonmagnetic conductive material, then the material acts similarly to a one turn shorted secondary of a transformer. The result is that the voltage in the space induces a current in the material, and currents called eddy currents flow in the conductive material. Since all conductive materials are lossy at room temperature, the eddy currents will result in energy loss. Each of the eddy currents generates a magnetic field counter to the field generated by the coil arrangement, which alters the magnitude and phase of the magnetic field of the coil arrangement in a manner indicative of the energy loss. The resulting change in magnitude and phase can be resolved into its real and imaginary parts with the real part being proportional to the real losses and the imaginary part being indicative of a reduction of the inductance that can be correlated to an effective negative permeability. The phenomena increases as frequency increases and therefore is more observable at the higher frequencies. Through mathematical modeling and properly selected multi-frequency measurements the various contributions of the total electromagnetic circuit can be resolved and isolated.

If the material is both conductive and magnetic, then a combination of these effects take place. Consequently the voltage/current/phase relationship in the coil arrangement is an indication of the coil arrangement's own reluctance path and energy loss as well as changes in the reluctance path and energy loss caused by surrounding materials.

The conductivity of internal components of a battery change as the battery is charged and discharged. Further, if the battery includes permeable materials, such as a nickel plate in a nickel-cadmium battery, the permeability of internal components of a battery change in accordance with the state of charge of a battery. The changes in conductivity and permeability can be detected by the arrangements previously described and separated from confounding noise sources. In particular, the inductance and resistance components of the electrical complex impedance of the coil arrangements reflect the changes in the battery materials when an alternating voltage is applied to the coil arrangements in close proximity to the battery. By correlating the effect that the conductivity and permeability changes in the battery have on the electrical complex impedance of the coil arrangements, the state of charge of the battery can be determined.

More specifically, the present invention includes applying an alternating voltage to the coil arrangements when in close proximity to a battery, and measuring the electrical complex impedance of the coil arrangement. Based on the electrical complex impedance of the coil arrangements, the state of charge of the battery is determined.

Nickel-Cadmium Batteries

Vented Nickel-Cadmium Battery

Coil arrangement 40 was tested with a 13 Ahr (C rate) vented nickel-cadmium battery. The battery was of prismatic type (parallel plate) constructed with multiple nickel and cadmium plates, starting with an outside cadmium plate on each side of the plate stack. The testing was performed with coil arrangement 40 clamped to the battery and oriented as described in connection with FIGS. 4 and 5. The battery was operated in a charge/rest/discharge cycle. The charge and discharge currents were applied at C/2 and C/4 rates.

The battery was monitored in a completely discharged condition for the first 100 minutes. At the 100 minute mark, the charging was initiated at C/2 charge rate. At approximately 200 minutes, the charging current was dropped to C/4 thus completing the charge cycle at around 288 minutes. The battery was then rested until about the 400 minute mark. After this rest, the battery was discharged at a C/2 rate until near the end of the discharge where the rate was lowered to C/4 at approximately 500 minutes into the test.

Figure 6:
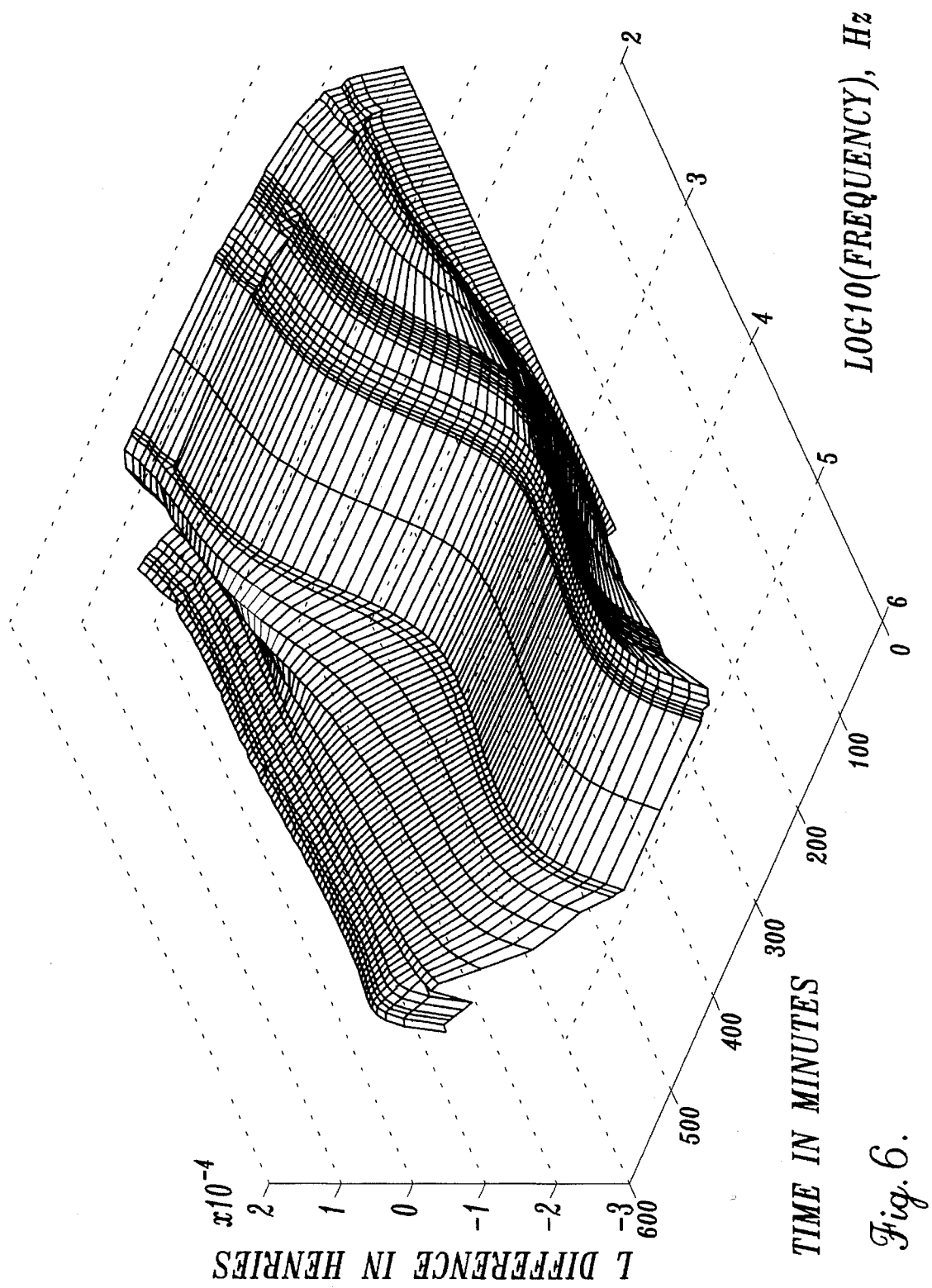
FIG. 6 is a plot of the difference in inductance versus frequency and time for the coil arrangement of FIG. 4 when mounted to a nickel-cadmium battery.

FIG. 6 shows a three dimensional plot of the change in inductance (also known as the imaginary part of the electrical complex impedance) of coil arrangement 40 versus log frequency versus test time. As shown in FIG. 6, the inductance change is a smooth function over the range of measurements. It also shows the inductance change with time following the battery testing regime of charge, rest and discharge.

Figure 7:
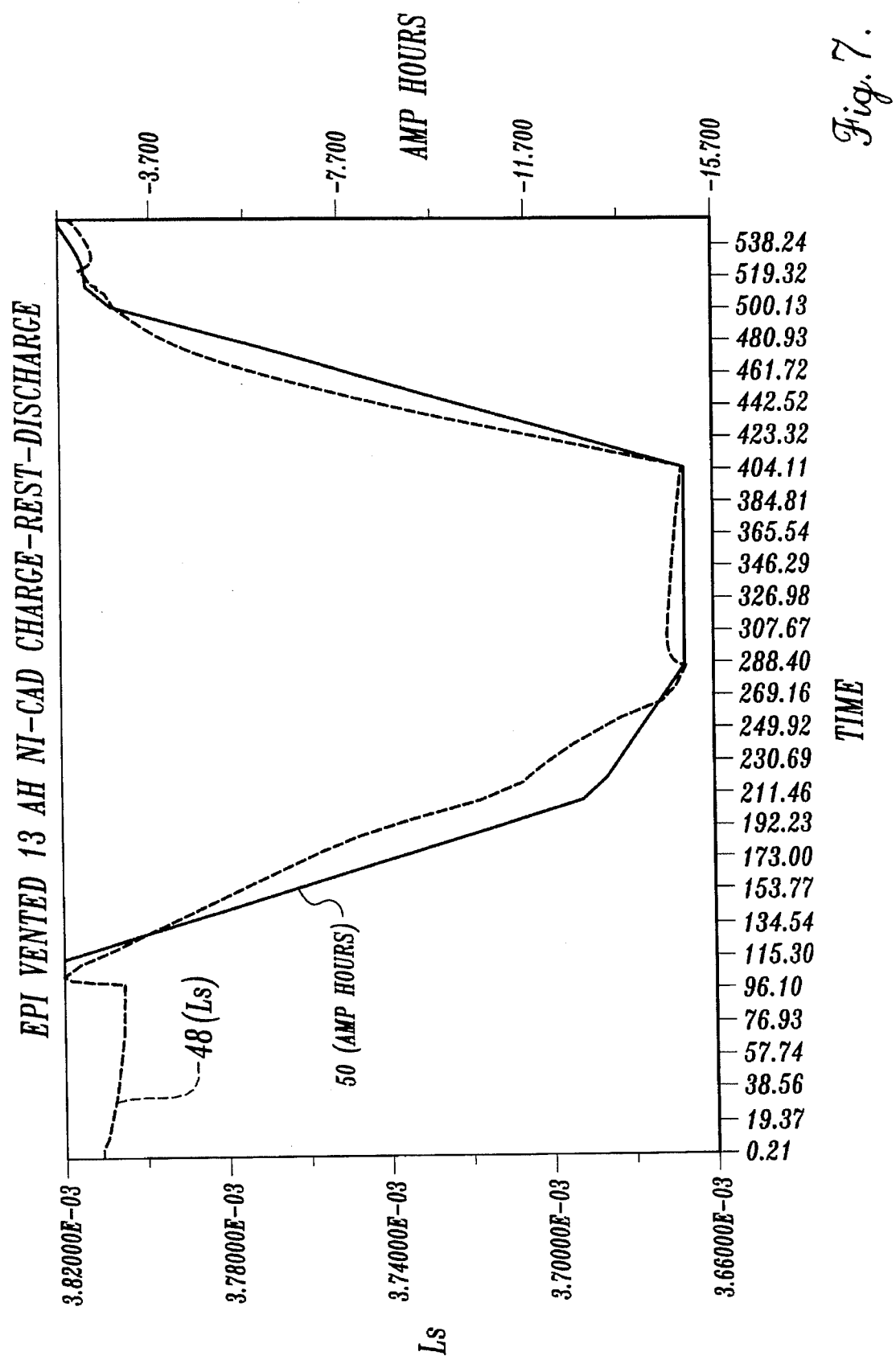
FIG. 7 is a plot of inductance versus time at 10 kHz for the coil arrangement of FIG. 4 when mounted to a nickel-cadmium battery and of the integrated amp hours delivered to and removed from the battery.

Curve 48 of FIG. 7 plots the inductance for coil arrangement 40 at 10 kHz during the above testing. For comparison, curve 50 plots the integration of amp hours that were applied to and removed from the nickel-cadmium test battery as an estimate of the state of charge of the battery. While amp hour integration is not an exact estimate of state of charge as previously discussed, under controlled conditions in a laboratory environment, the accuracy of such an estimate can be made acceptable. FIG. 7 clearly shows that the inductance of coil arrangement 40 can be correlated closely to the state of charge of a nickel-cadmium battery.

Sealed Nickel-Cadmium Battery

Further testing was conducted with a 17 Ahr (C rate) nickel-cadmium battery, using coil configuration 20. This battery was of prismatic construction as with the vented nickel-cadmium battery. However, in the sealed nickel-cadmium battery the electrolyte is suspended in a separator material, so that there is less electrolyte available relative to a vented nickel-cadmium battery. The testing was performed with coil arrangement 20 clamped to the battery and oriented as described in connection with FIG. 3.

Figure 8:
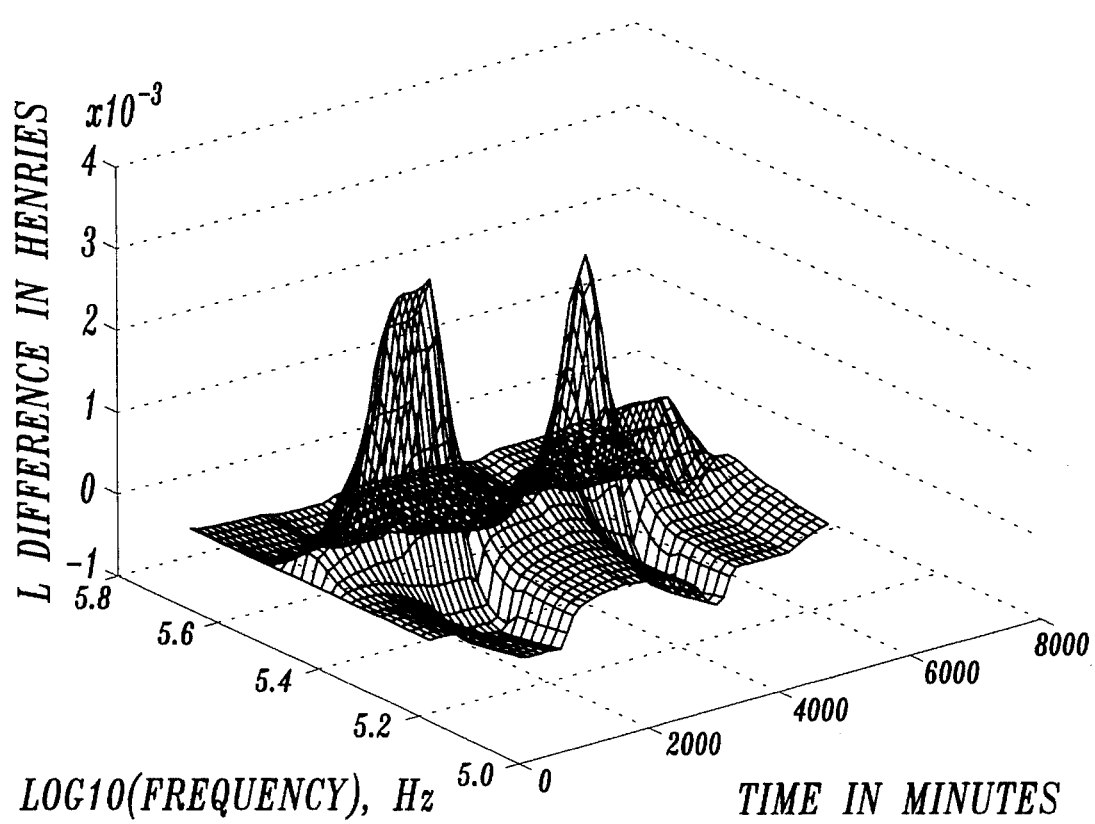
FIG. 8 is a plot of the difference in inductance versus frequency and time for the coil arrangement of FIG. 1 when mounted to a nickel-cadmium battery.

The test was conducted for multiple charge/rest/discharge cycles. Additionally, a rest cycle was performed part way through one of the discharge cycles to insure that coil arrangement 20 would continue to track the state of charge of the battery. FIG. 8 shows the difference between the measured inductance of coil arrangement 20 at time zero, and at periodic intervals during the test. The data was taken near the resonant frequency of coil arrangement 20 from 150 kHz to 450 kHz. An HP 4194 impedance analyzer was used to take the data, and a computer program was written to take the data at the periodic intervals.

Figure 9:
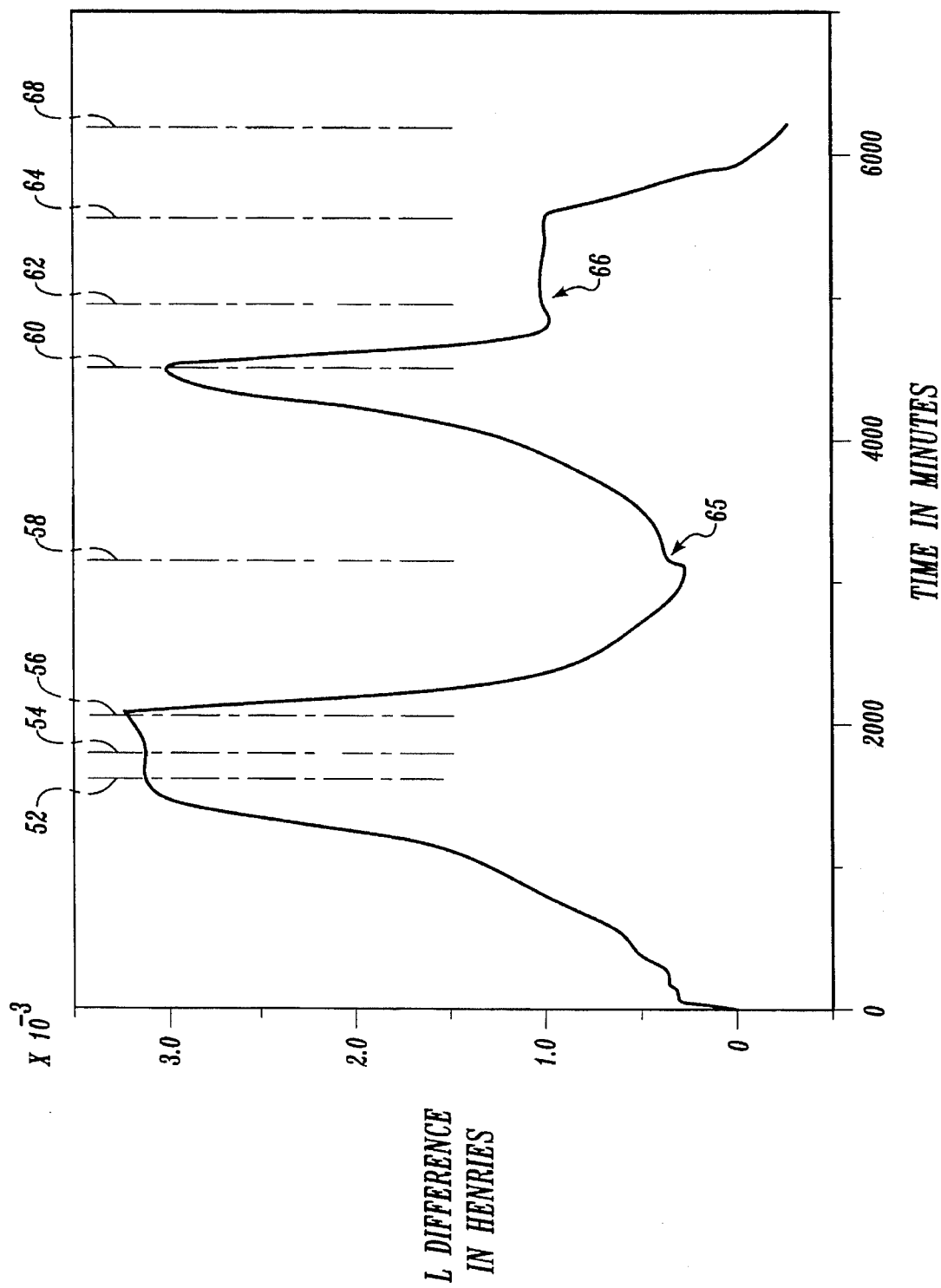
FIG. 9 is a cross-section of the plot of FIG. 8 at 272 kHz.

FIG. 9 is a 2-D projection of FIG. 8 at 272 kHz. The testing started at a C/20 charge rate until approximately 1200 minutes into the test, indicated by phantom-line 52 in FIG. 9, whereupon a short rest period was initiated, indicated by phantom-line 54. Then a short C/20 charge rate period was conducted, indicated by phantom-line 56, followed by a C/20 discharge rate starting at around 2000 minutes, and ending at about 3000 minutes, indicated by phantom-line 58. A second C/20 charge rate was then conducted, lasting until about the 4500 minute mark, indicated by phantom-line 60. The battery was then discharged at a C/20 rate until approximately the 5000 minute mark, indicated by phantom-line 62. The discharge was followed by a rest period until around the 5500 minute mark, indicated by phantom-line 64. Finally the battery was completely discharged and the test was concluded.

As can be seen from FIGS. 8 and 9, there is a well defined change in inductance of coil arrangement 20 in response to charging and discharging of the battery. Further, the cell holds a defined state during rest times. The cause of the shifts of the peaks and valleys has not been determined at this point. It appears that in order to correlate charge to measured values, a practical system will need to keep track of peak migration and account for the nonlinearity. The smoothness of the function in FIGS. 8 and 9 indicates that the measured signal adequately exceeds the noise level.

By comparing FIG. 8 with FIG. 6, it can be seen that higher signal strength was achieved with coil arrangement 20 relative to coil arrangement 40. Specifically, with coil arrangement 20, the greatest difference in inductance was about 0.0003 Henries, while with coil arrangement 20 the greatest difference in inductance was about 0.003 Henries.

Figure 10:
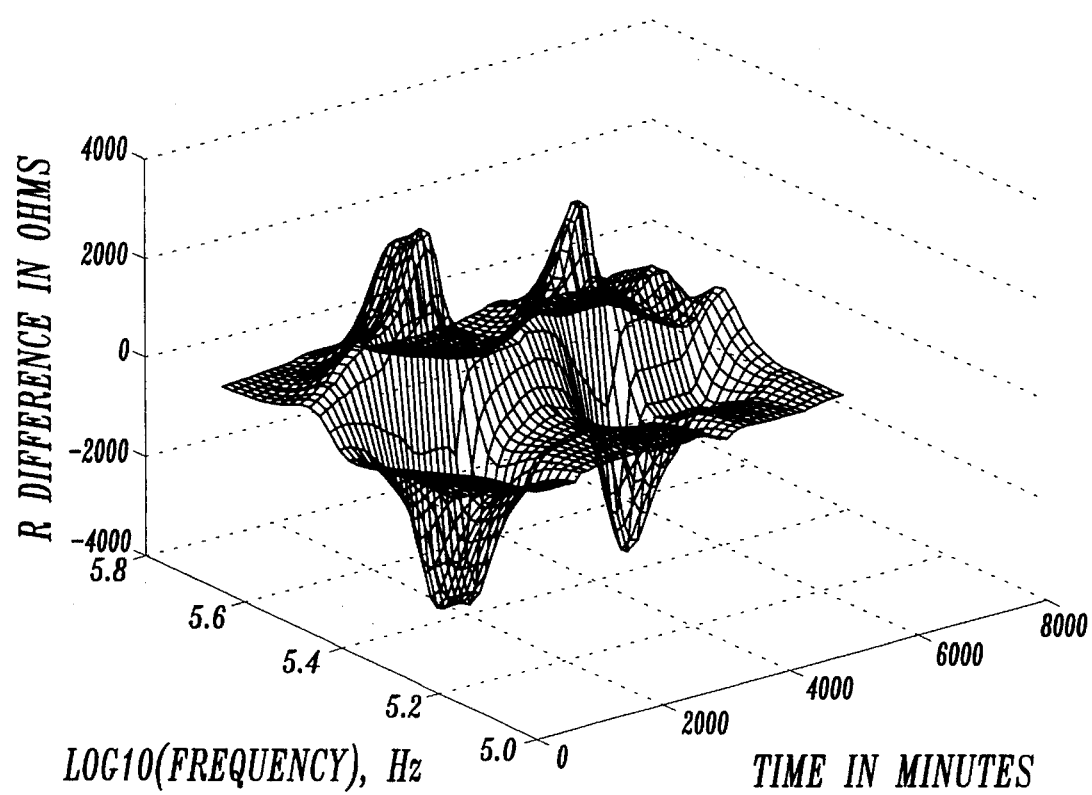
FIG. 10 is a plot of the difference in resistance versus frequency and time for the coil arrangement of FIG. 1 when mounted to a nickel-cadmium battery.
Figure 11:
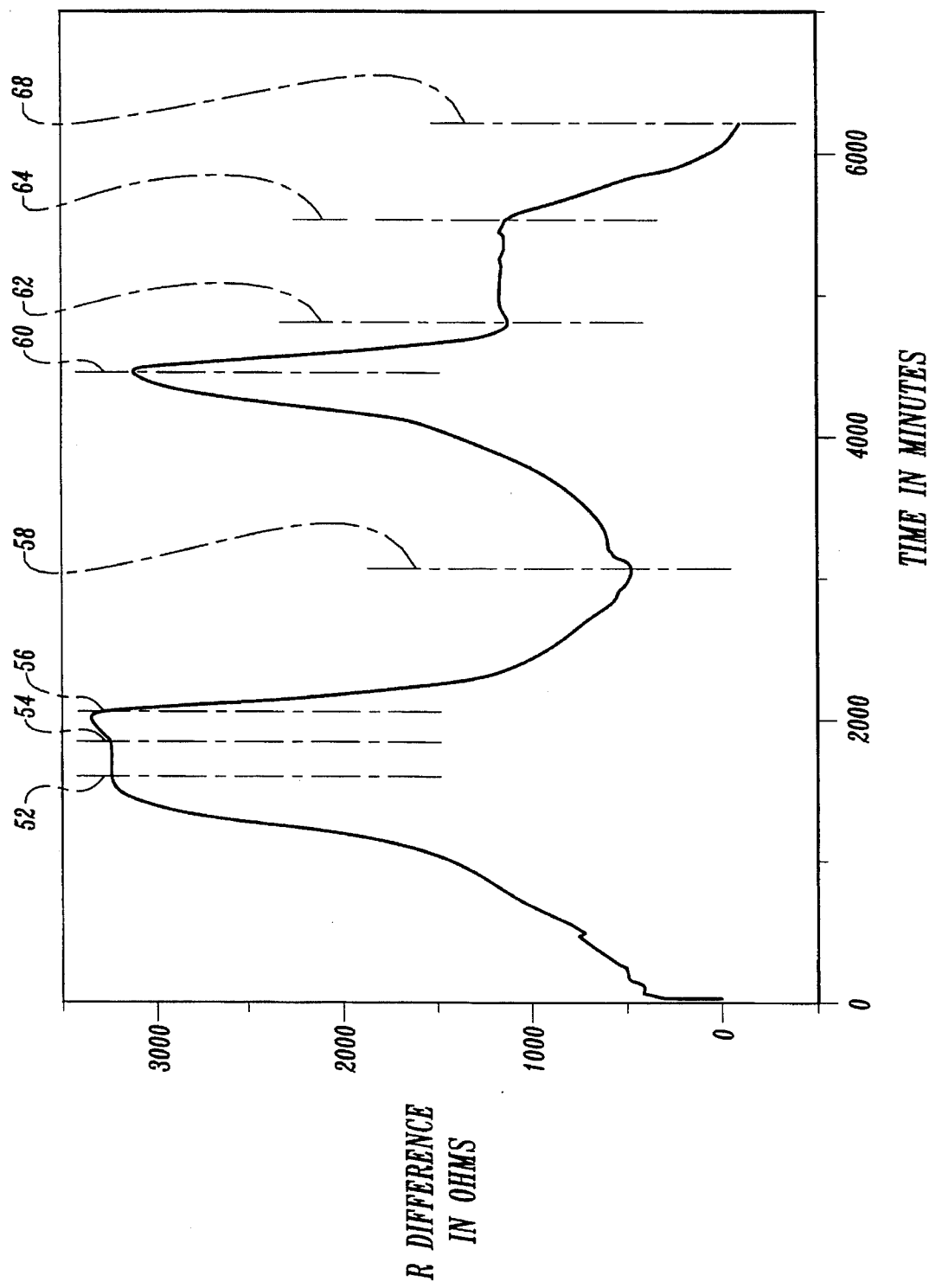
FIG. 11 is a cross-section of the plot of FIG. 10 at 312 kHz.

In the same manner as FIG. 8, FIGS. 10 shows difference data for resistance (also known as the real portion of the electrical complex impedance). FIG. 11 is a 2-D projection of FIG. 10 at 312 kHz. As can be seen from FIGS. 8–11, both inductance and resistance of a coil arrangement can be correlated with state of charge of a battery. This is advantageous, in that resistance and inductance information can be used to corroborate one another in determining the state of charge of a battery. In particular, an initial determination of state of charge of a battery can be made based on inductance information, which determination can then be finalized by comparison with resistance information.

Figure 12:
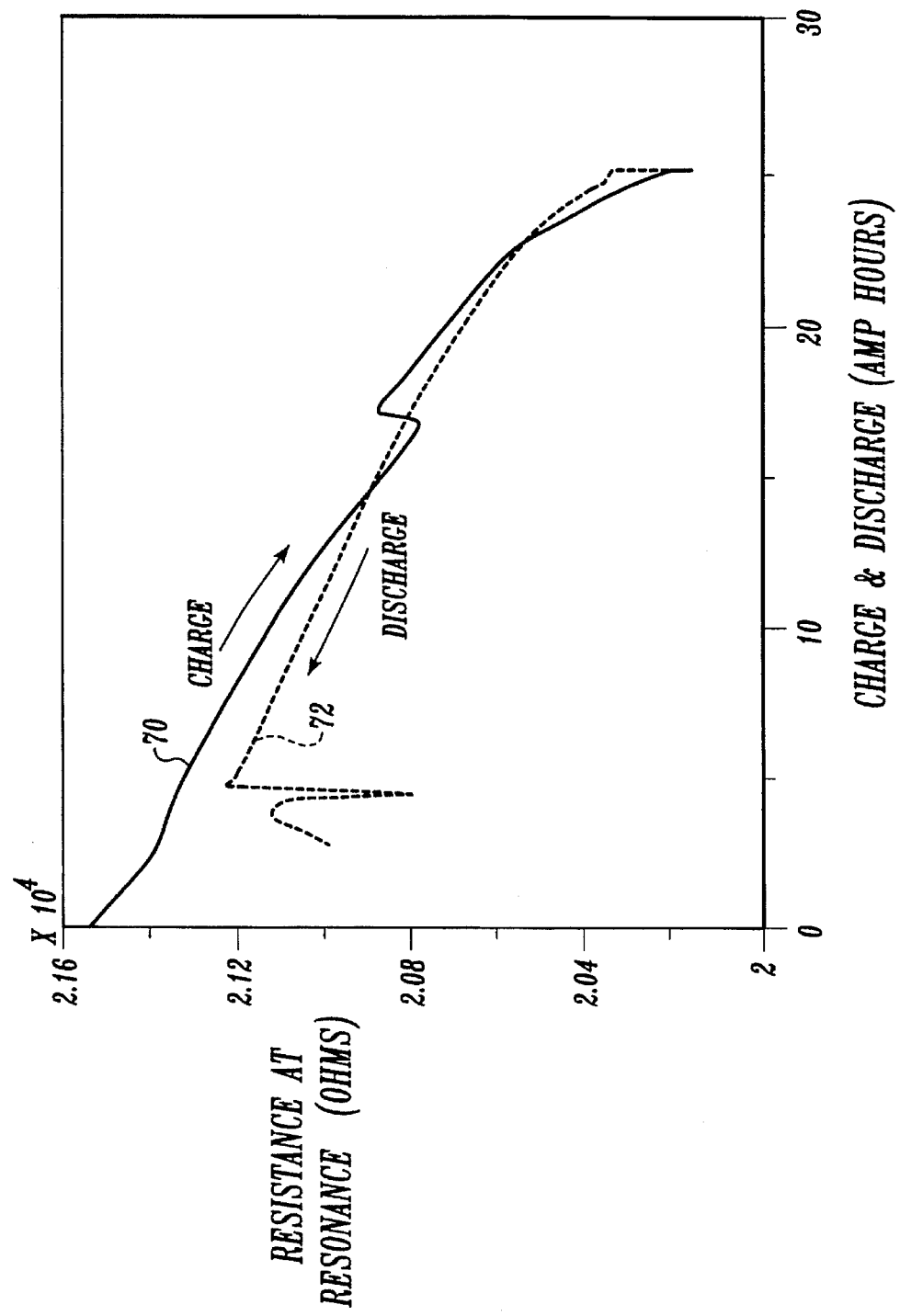
FIG. 12 is a plot of the resistance of the coil arrangement of FIG. 1 versus the state of charge of a battery.

Another indication of the correlation between impedance of a coil arrangement and battery state of charge is illustrated by FIG. 12, where the resistance value of coil arrangement 20 at its resonance frequency is plotted versus amp-hours applied and removed from the battery. As can be seen from this plot, the resistance of coil arrangement 20 during charging (curve 70) follows a nearly identical path during discharging of the battery (curve 72).

Portions of the curve in FIG. 9 identified by reference numerals 65 and 66, and portions of the curve in FIG. 11 identified by reference numerals 67 and 69 are believed to be due to diffusion effects. Chemically, the sections of a battery plate closest to the separator and an opposing plate will react first. Thus, there is a chemical gradient that takes place in the plates during the charge/discharge cycles. This effect could be accounted for to increase accuracy in determining state of charge of a battery using a coil arrangement. By using multiple frequencies, it is possible to penetrate to various depths into the plates to potentially further correct and/or avoid diffusion effects.

More particularly, the depth of penetration of an oscillatory magnetic field into a material is a function of the apparent conductivity and permeability of the material and the frequency of the field. Equation 1 shows the depth of the penetration function, wherein $i_o$ is the initial signal, and i is the signal attenuated by a conductive material:

$$i = i_0 * e^{-x*\sqrt{\frac{u*\pi*f}{p}}}$$ Equation-1 x=the thickness of the plate in meters u=4*pi*10$^{-7}$*u$_o$ u$_o$=permeability multiplier, for air and cadmium, it=1 p=resistivity in ohm-meters

Thus, different frequencies can be selected to achieve different depths of penetration to avoid or detect diffusion effects.

Cadmium has a low resistivity, (approximately 8.5*10$^{-8}$ ohm-meters, or ⅕ that of copper), and thus makes a very good shield. The depth of penetration through a cadmium plate at 300 kHz is only about 10.5 mils. A 24 mil thick sheet of cadmium would attenuate the signal to 10% of its original value.

Hence, the inside nickel plate is having very little effect on the magnetic field generated by the coil arrangement. The reason for the change of inductance in FIGS. 6–9 is believed to be due to transformer effect. In other words, the outside plate is acting like a shorted secondary of a transformer. The reflected signal is always in a direction to cause a decrease in the field that caused it and because the signal is moving between appearing inductive to appearing capacitive, there is a peaking which occurs. The more conductive the plate becomes, the better it is at reflecting the field back. Therefore, what is being observed in these figures is all resulting from conductivity changes.

If it is desired to measure the permeability and conductivity of an inside nickel plate, the coil arrangement could be operated at lower frequencies where the depth of penetration of the magnetic field through the outside cadmium plate is sufficient to be significantly affected by changes in the inside nickel plate.

Lead Acid Batteries

A 5 Ahr (C rate) sealed lead acid battery was also tested. The testing was performed with coil arrangement 40 clamped to the battery and oriented as described in connection with FIG. 4. The battery was a "mono-block" construction where positive and negative cells are built up to form a 12 V battery in a single enclosure. Coil arrangement 40 was clamped adjacent a negative plate of the battery. Impedance of coil arrangement 40 was monitored with a Stanford Research Systems (SRS) impedance bridge at a constant frequency of 10 kHz with a 100 mV drive.

This testing was performed on a cell whose initial state of charge was unknown. The test started with a short discharge pulse, followed by a short rest and then a constant voltage charge. After the charge a rest time was initiated followed by a discharge period where the discharge rate varied in steps from C to C/4.

Figure 13:
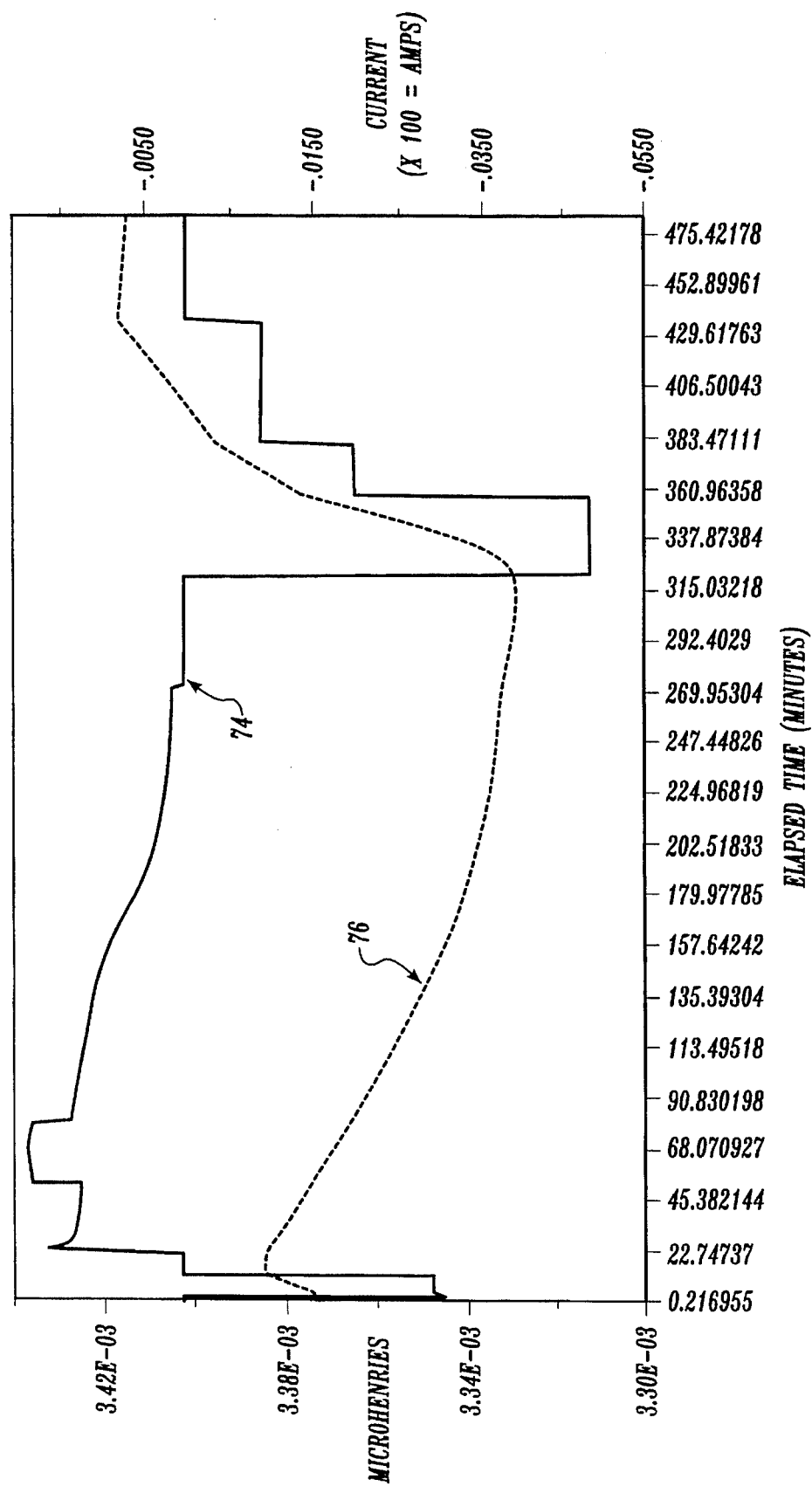
FIG. 13 is a plot of inductance versus time for the coil arrangement of FIG. 4 at 10 kHz when mounted to a lead-acid battery, and of the current applied or removed from the battery.

Curve 74 of FIG. 13 illustrates the current applied or removed from the battery, while curve 76 illustrates the inductance of coil arrangement 40 for the same period of time. The inductance change is caused by the eddy current loss effects due to the conductivity change in the electrode materials because there are no permeability changes in a lead acid battery reaction. The data shows that a coil arrangement is also capable of monitoring the state of charge of lead acid battery types.

Battery Component Testing

Testing of Battery Electrolyte

During battery charging and discharging, the chemical concentration levels in the battery electrolyte change. A test was performed to monitor the change in coil impedance caused by changes in electrolyte concentration for levels of concentration typically found in both lead-acid and nickel-cadmium batteries. The electrolyte in a lead-acid battery is a mixture of sulfuric acid ($H_2SO_4$) and water, while the electrolyte in nickel-cadmium batteries is a mixture of potassium hydroxide (KOH) and water. Concentration levels from pure water to 35% electrolyte solution were tested.

For the electrolyte testing, coil arrangement 40 was used. A Stanford Research Systems (SRS) impedance bridge at constant frequencies of 10 kHz and 100 kHz with a 100 mV drive was used to monitor the impedance of coil arrangement 40. The test included mounting coil arrangement 40 to the side of a battery as described in connection with FIGS. 4 and 5, with the internal components of the battery having been removed. Specifically, the electrolyte, plates, and electrodes were removed from the battery, leaving an empty battery case.

The first part of the test comprised measuring the inductance of coil arrangement 40 with no solution in the battery case. Then the battery case was filled with distilled water to a level above coil arrangement 40. The concentration of potassium hydroxide was slowly increased by gradually adding solid potassium hydroxide to the water and dissolving it into solution. The measurements of sulfuric acid was performed by starting with concentrated sulfuric acid and reducing the concentration gradually with distilled water. The resistance and inductance for the coil arrangement 40 was measured at various concentrations for both the potassium hydroxide and the sulfuric acid.

Figure 14:
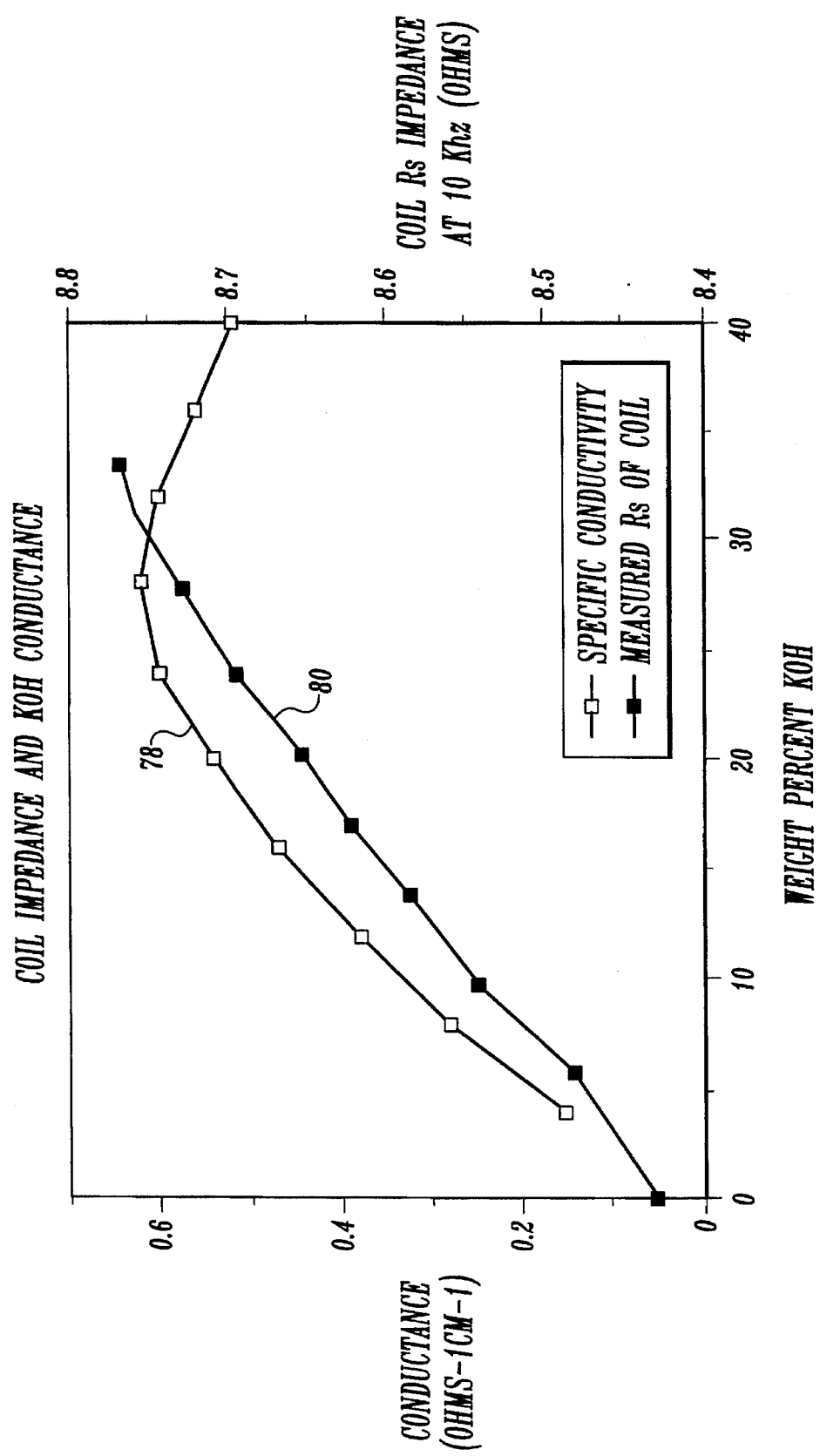
FIG. 14 is a plot of resistance versus concentration of potassium hydroxide for the coil arrangement of FIG. 4 at 10 kHz, and of the conductivity of potassium hydroxide at various concentration levels.

Published data is available for the value of the specific conductance of both of the electrolyte solutions at various concentrations. Curve 78 of FIG. 14 plots published data for the specific conductivity of potassium hydroxide at various concentrations. In comparison, curve 80 plots the resistance of coil arrangement 40 at various concentrations for potassium hydroxide. As can be seen, the resistance of coil arrangement 40 can be correlated closely with the specific conductivity of potassium hydroxide at various concentrations.

Figure 15:
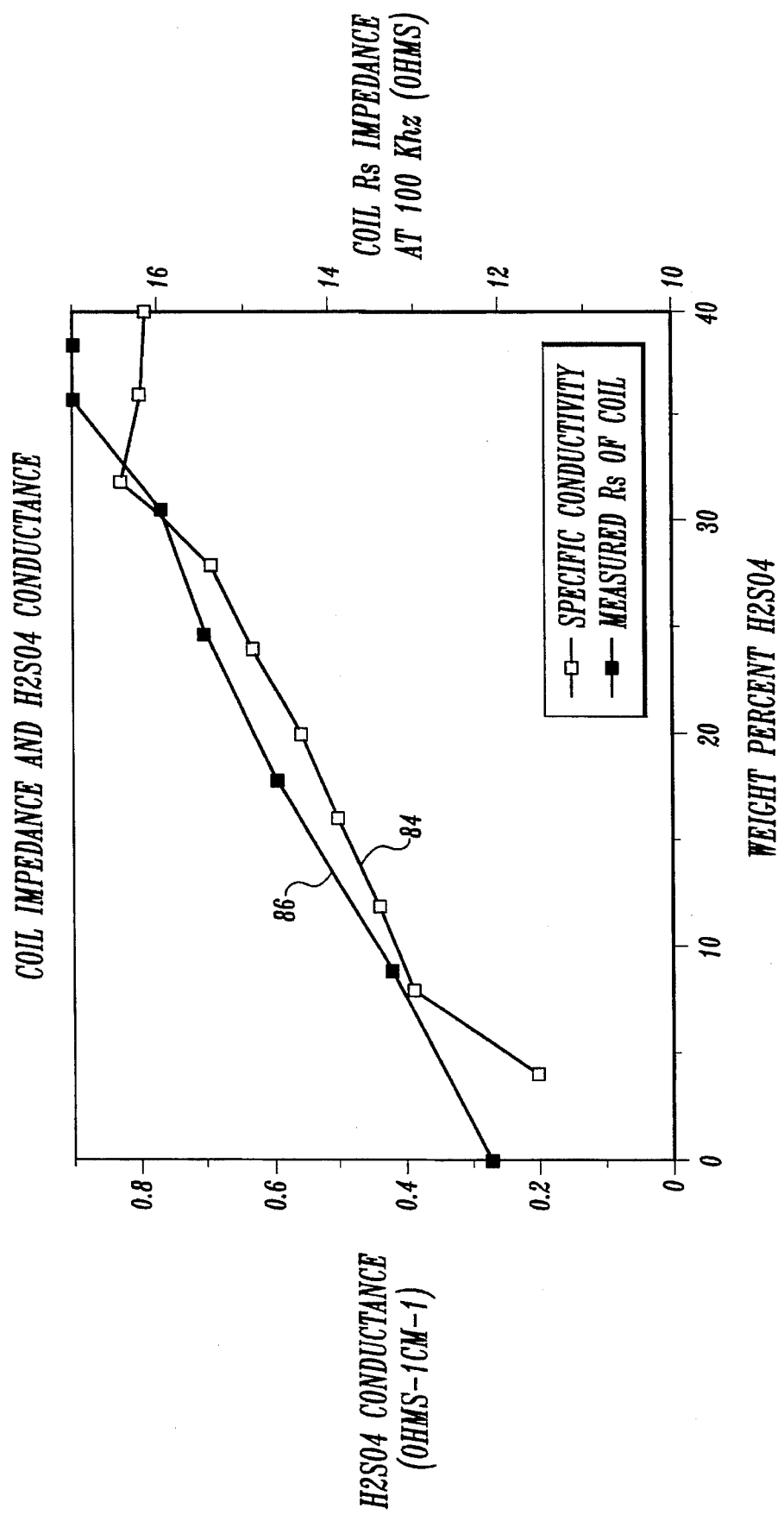
FIG. 15 is a plot of resistance versus concentration of sulfuric acid for the coil arrangement of FIG. 4 at 10 kHz, and of the conductivity of sulfuric acid at various concentration levels.

The same is true for sulfuric acid as shown in FIG. 15. Curve 84 plots published data for the specific conductivity of sulfuric acid at various concentrations, while curve 86 plots the resistance of coil arrangement 40 at various concentrations of sulfuric acid.

Comparison of FIGS. 14 and 15 with FIGS. 10–12 show that the resistance change in a coil arrangement is small due to changes in electrolyte concentration, relative to the change in resistance of a coil arrangement due to the change in state of charge of the battery. This indicates that the large change in resistance of a coil arrangement caused by state of charge, is not primarily due to changes in electrolyte concentration of the battery.

Finally, FIGS. 14 and 15 indicate that concentrations of a chemical solution can be measured with a coil arrangement.

Testing of Battery Plates

A test was performed on a nickel plate and a cadmium plate of a nickel-cadmium battery to determine the individual contribution of each plate to changes in the inductance of a coil arrangement due to changes in the state Of charge of a battery. The test included disassembling a discharged battery, and measuring the inductance of coil arrangement 40 when in close proximity to each plate. Then the battery was reassembled and fully charged. Finally, the battery was disassembled again, and the inductance of coil arrangement 40 was measured again when in close proximity to each plate. A Stanford Research Systems (SRS) impedance bridge at a constant frequency of 10 kHz with a 100 mV drive was used to measure the inductance of coil arrangement 40. The results of the test are summarized in the following table:

| Charge State | No Plate (Inductance) | Nickel Plate (Inductance) | Cadmium Plate (Inductance) |
| --- | --- | --- | --- |
| Discharged | 4.8 mH | 3.25 mH | 5.51 mH |
| Charged | 4.8 mH | 5.40 mH | 5.35 mH |

The results show that each of the battery plates had an appreciable effect on the inductance measurement of the coil arrangement due to changes in state of charge of the battery. The increase in measured inductance on the nickel plate with increased charge is caused by increased permeability of the nickel plate. The increase in permeability reduces the reluctance path of the target plate decreasing the overall reluctance path of the coil, thus increasing the measured inductance. This parameter is best measured at lower frequencies so as to reduce the effect which eddy currents contribute.

The decrease in measured inductance of the cadmium plate is caused by increased conductivity of the cadmium plate. The increased conductivity allows higher eddy currents which in turn cause increased reflected magnetic fields from the surface of the cadmium back to the coil which are in a direction to cancel the initial field (classic electromagnetic theory). The eddy current effect is best measured at higher frequencies. The isolation of these components from one another is important to the understanding of state of charge of the battery. It improves the measurement process through improved signal-noise-ratio since these components are orthogonal to each other, as well as distinguishing the contributing plates through selected frequency analysis.

Signal-to-Noise Ratio Testing

Testing was conducted with different coil arrangements and orientations to determine configurations that maximized the signal-to-noise ratio when measuring the state of charge of a battery. In this test, a battery of a first charge state was modeled by a set of more-or-less parallel aluminum plates spaced apart, and approximately radially aligned with one another. The plates were sized and spaced a distance apart from one another approximately equal to the size and spacing of plates in a lead-acid battery typically used in motorcycles. A second charge state of the battery was measured by duplicating the foregoing model with a set of copper plates.

Next, coil arrangement 20 was mounted to the side of the aluminum battery model in the same way that the coil arrangement was mounted to the side of an actual battery (see FIG. 3 and the accompanying description). The impedance of coil arrangement 20 was then measured from frequencies of 100 Hz to 1 MHz while mounted to the aluminum battery model. The foregoing was repeated with the copper battery model. The difference in measured impedance between the aluminum and copper battery models was taken to be the signal.

The impedance of coil arrangement 20 was then again measured from 100 Hz to 1 MHz, but while mounted to an actual battery with an electric drill operating in close proximity to the battery to simulate EMI. Signal-to-noise ratio was calculated by dividing the signal by the root means squared (rms) of the noise.

The above was repeated with core 24 removed from coil arrangement 20. In other words, only with coil 22 being used.

Finally, the above was repeated with an encircling coil configuration. That is, the coil was mounted to a battery, or a battery model such that the battery was located at the winding axis of the coil with the battery plates more-or-less parallel to the winding axis. The coil was formed by winding 48 turns of wire of approximately 33 or 35 gauge to form a coil of approximately 1 mH.

Figure 16:
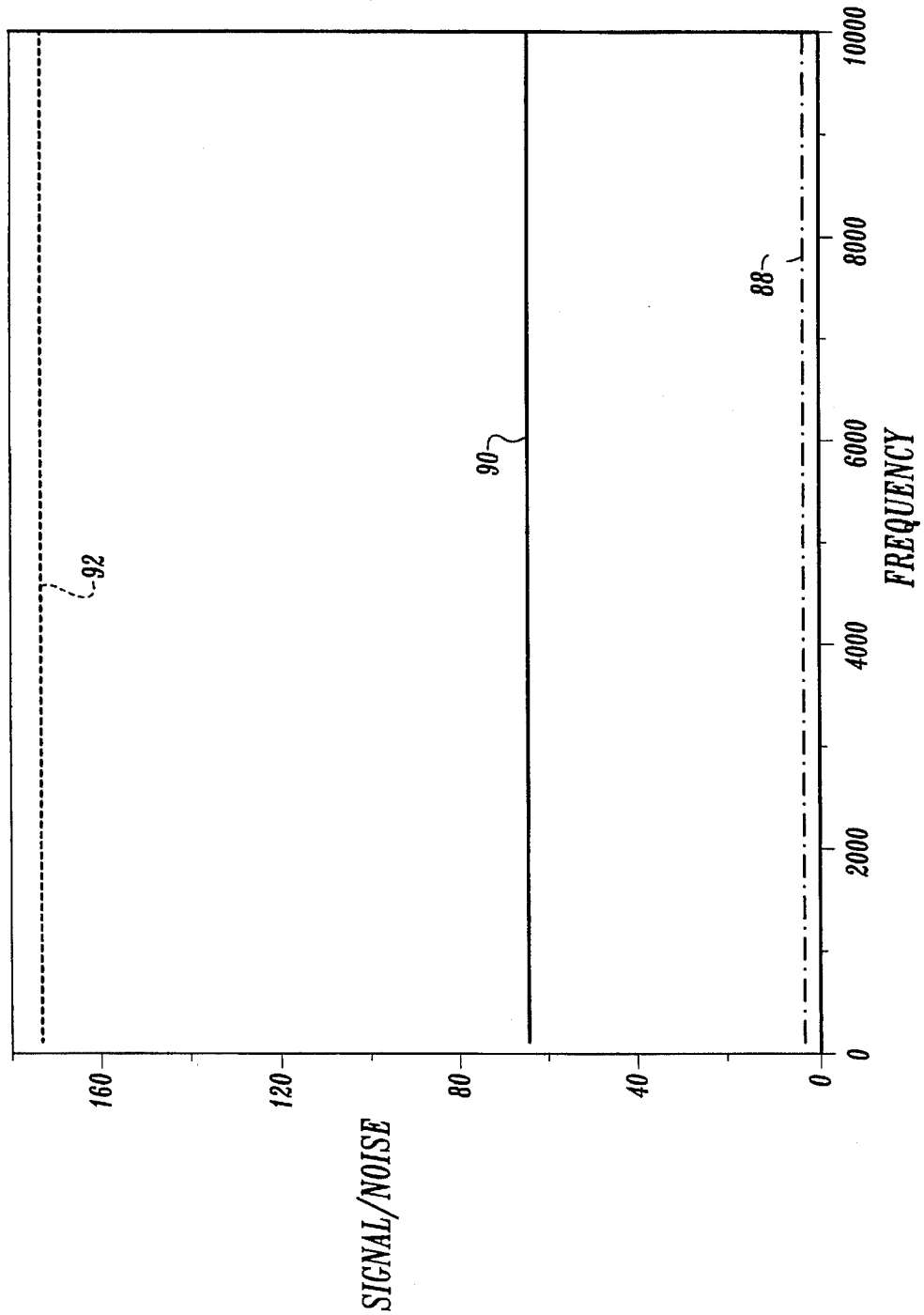
FIG. 16 is a plot summarizing signal-to-noise ratio data for several coil arrangements.

The results of the signal-to-noise ratio testing are presented in FIG. 16. Curve 88 of FIG. 16 is for the encircling coil arrangement, which has a signal-to-noise ratio of about 3. In comparison, curve 90 is for coil 22, i.e. without a core, mounted to the side of a battery as described in connection with FIG. 3. The signal-to-noise ratio for this configuration is approximately 64.2.

Last, curve 92 is for coil arrangement 20 mounted to side of a battery, also as described in connection with FIG. 3. This configuration achieved a clearly superior signal-to-noise-ratio of approximately 171.8.

Mathematically Modeling a Battery Component

Figure 17:
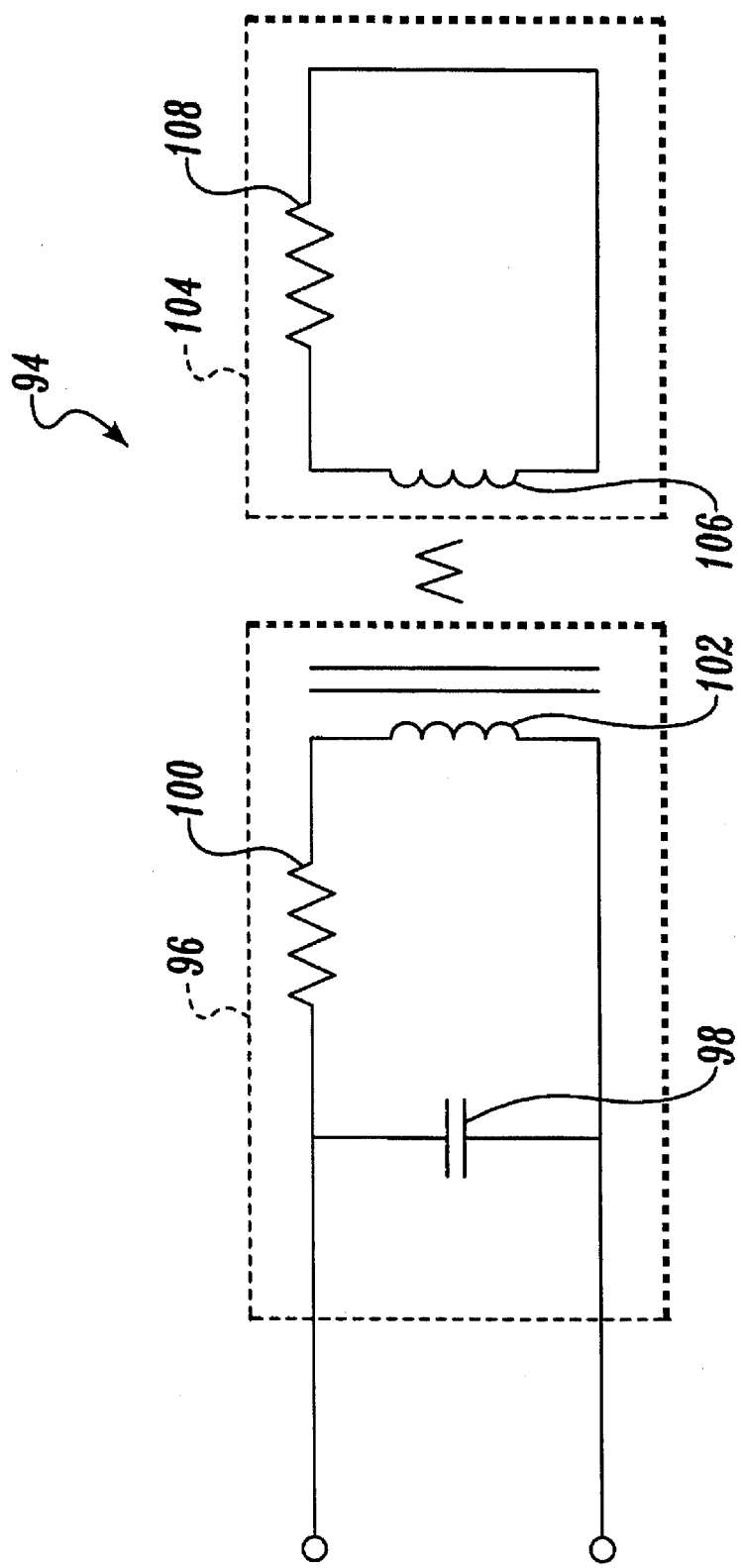
FIG. 17 is a diagram of an electrical model of a coil arrangement and an internal battery component.

A coil arrangement mounted to the side of a battery as described in connection with FIGS. 3 and 4, and an internal battery component, may be modeled as a transformer 94 as shown in FIG. 17. The coil arrangement is modeled as the transformer primary 96, having a capacitor 98 in parallel with a resistor 100 and coil 102 in series. An internal battery component, such as a plate, is modeled as a shortened transformer secondary 104, having a coil 106 in series with a resistor 108. Using the model and Laplacian transforms, the complex electrical impedance, Z, for the coil arrangement is as shown in Equation 2:

$$Z = \frac{1}{c*s} - \frac{rx = lx*}{c^2*s^2*(-M^2*s^2) + \left(rp + \frac{1}{c*s} + lp*s\right)*(rx + lx*s))} \quad \text{Equation-2}$$

Where:

Z=sensor impedance $s=(-1^{\wedge}.5)*2*Pi*f$ f=frequency $M=k*(lp*rp)^{\wedge}.5$ (the mutual coupling term)

k=the coefficient of coupling between the sensor and plate lp=coil arrangement (primary) inductance lx=equivalent inductance of the plate represented by the eddy current area rp=coil series (primary) resistance rx=equivalent resistance of the plate represented by the eddy current area c=coil capacitance It is evident from the above equation and other similar mathematical representations that the permeability and conductivity of the internal battery component can be derived from prior knowledge of the coil arrangement. This is of course available. More particularly, the inductance of the coil arrangement be calculated from Equation 3:

$$L = \frac{N^2}{\frac{la}{A_a U_o} + \frac{lt}{A_t U_o U_t} + \frac{lc}{A_c U_o U_c}} \quad \text{Equation-3}$$

Where:

L=inductance

N=number of turns in the coil la=magnetic length of air gap lt=magnetic length of target plate lc=magnetic length of core Aa=Area of magnetic path for air At=Area of magnetic path for target plate Ac=Area of magnetic path for core Uo=permeability constant for air Ut=permeability multiplier for the target plate material (usually a function of temperature, and drive level or flux density, and is complex with hysteresis)

Uc=permeability multiplier for the core material (usually a function of temperature, and drive level or flux density, and is complex with hysteresis)

There are two unknowns, permeability and conductivity. Thus, measuring the impedance of the coil arrangement at two reasonably separated frequencies allows calculation of the two unknowns.

While the preferred embodiment of the invention has been illustrated and described, it will be appreciated that various changes can be made therein without departing from the spirit and scope of the invention.

The embodiments of the invention in which an exclusive property or privilege is claimed are defined as follows:

1. A method for measuring the state of charge in an electrochemical battery, the battery having an anode including a first sheet of material, and a cathode including a second sheet of material, comprising the steps of:

(a) providing a coil;

(b) positioning the coil relative to the battery to minimize the reluctance path between the coil and a selected sheet;

(c) orienting the coil so that the winding axis of the coil is generally transverse to the surface of the selected sheet;

(d) applying an alternating current of a first frequency to the coil to generate a first oscillatory magnetic field;

(e) providing a means for concentrating the oscillating magnetic field in a direction towards the selected sheet;

(f) measuring the electrical complex impedance of the coil at the first frequency;

(g) determining the state of charge of the battery based upon the measured electrical complex impedance of the coil by comparing the measured electrical complex impedance of the coil with data correlating the state of charge of the battery with electrical complex impedance of the coil.

2. The method of claim 1, wherein the step of providing a means for concentrating the magnetic field comprises the substep of providing a core for the coil.

3. The method of claim 2, wherein the step of providing a means for concentrating the magnetic field comprises the sub step of providing a backing plate for the coil, wherein the backing plate includes a magnetically permeable material which is poorly conductive.

4. The method of claim 1, further comprising the step of selecting a coil that has a maximum diameter no greater than the width of any of the sheets, and no greater than the length of any of the sheets.

5. A method for measuring the state of charge in an electrochemical battery, the battery having an anode including a first sheet of material, and a cathode including a second sheet of material, comprising the steps of:

(a) providing a coil;

(b) positioning the coil relative to the battery to minimize the reluctance path between the coil and a selected sheet;

(c) orienting the coil so that the winding axis of the coil is generally transverse to the surface of the selected sheet;

(d) applying an alternating current of a first frequency to the coil to generate a first oscillatory magnetic field;

(e) providing a means for concentrating the oscillating magnetic field in a direction towards the selected sheet;

(f) measuring the electrical complex impedance of the coil at the first frequency;

(g) determining the state of charge of the battery based upon the measured electrical complex impedance of the coil;

(h) applying an alternating current at a plurality of frequencies to the coil to generate a plurality of oscillatory magnetic fields; and (i) measuring the electrical complex impedance of the coil at the plurality of frequencies.

6. The method of claim 5, wherein the step of determining the state of charge of the battery based upon the complex impedance of the coil, comprises the substeps of:

(a) mathematically modeling the coil and at least one chosen sheet based on electrical equivalents; and (b) using the mathematical model of the coil and the chosen sheet, and the measured electrical complex impedance of the coil at the plurality of frequencies, to determine the permeability and conductivity of the chosen sheet; and (c) determining the state of charge of the battery based upon the permeability and conductivity of the chosen sheet.

7. A method for measuring the state of charge in an electrochemical battery, the battery having an anode including a first sheet of material, and a cathode including a second sheet of material, comprising the steps of:

(a) providing a coil;

(b) positioning the coil relative to the battery to minimize the reluctance path between the coil and a selected sheet;

(c) orienting the coil so that the winding axis of the coil is generally transverse to the surface of the selected sheet;

(d) applying an alternating current of a first frequency to the coil to generate a first oscillatory magnetic field, and selecting the first frequency to maximize the effect the selected sheet has on the electrical complex impedance of the coil;

(e) providing a means for concentrating the oscillating magnetic field in a direction towards the selected sheet;

(f) measuring the electrical complex impedance of the coil at the first frequency; and (g) determining the state of charge of the battery based upon the measured electrical complex impedance of the coil.

8. A method, for measuring the state of charge in an electrochemical battery, the battery having an anode including a first sheet of material, and a cathode including a second sheet of material, comprising the steps of:

(a) providing a coil;

(b) positioning the coil relative to the battery to minimize the reluctance path between the coil and a selected sheet:

(c) orienting the coil so that the winding axis of the coil is generally transverse to the surface of the selected sheet;

(d) applying an alternating current of a first frequency to the coil to generate a first oscillatory magnetic field;

(e) providing means for concentrating the oscillating magnetic field in a direction towards the selected sheet;

(f) measuring the electrical complex impedance of the coil at the first frequency; and (g) determining the state of charge of the battery based upon the measured electrical complex impedance of the coil by:

(i) reducing the measured electrical complex impedance of the coil into first and second component terms;

(ii) making a first initial determination of the state of charge of the battery based upon the first component term;

(iii) making a second initial determination of the state of charge of the battery based upon the second component term; and (iv) making a final determination of the state of charge of the battery based upon the first and second initial determinations.

9. The method of claim 8, wherein the first component term is the real part of the electrical complex impedance of the coil, and the second component term is the imaginary part of the electrical complex impedance of the coil.

10. A method for measuring a physical parameter of a chemical solution residing in a container, comprising the steps of:

(a) providing a coil;

(b) positioning the coil relative to the container to minimize the reluctance path between the coil and the solution in the container;

(c) orienting the coil so that the winding axis of the coil is generally transverse to the surface of the container;

(d) applying an alternating current to the coil to generate an oscillatory magnetic field;

(e) providing a means for concentrating the first oscillating magnetic field in a direction towards the solution in the container;

(f) measuring the electrical complex impedance of the coil; and (g) determining the physical parameter of the solution based upon the measured electrical complex impedance of the coil by comparing the measured electrical complex impedance of the coil with data correlating the physical parameter of the chemical solution with electrical complex impedance of the coil.

11. A method for measuring a physical parameter in an electrochemical process occurring within a predefined volume, comprising the steps of:

(a) providing a coil;

(b) positioning the coil relative to the predefined volume to minimize the reluctance path between the coil and the electrochemical process;

(c) orienting the coil so that the winding axis of the coil is generally transverse to a surface bounding the predefined volume;

(d) applying an alternating current at a first frequency to the coil to generate a first oscillatory magnetic field;

(e) providing a means for concentrating the first oscillating magnetic field in a direction towards the electrochemical process;

(f) measuring the electrical complex impedance of the coil at the first frequency; and (g) determining the physical parameter based upon the measured electrical complex impedance of the coil by comparing the measured electrical complex impedance of the coil with data correlating the physical parameter with electrical complex impedance of the coil.

12. The method of claim 11, wherein the step of providing a means for concentrating the magnetic field comprises the substep of providing a core for the coil.

13. The method of claim 11, wherein the step of providing a means for concentrating the magnetic field comprises the substep of providing a backing plate for the coil, wherein the backing plate includes a magnetically permeable material which is poorly conductive.

14. The method of claim 11, wherein the step of determining the physical parameter based upon the electrical complex impedance of the coil, comprises the substeps of:

(a) reducing the measured complex impedance of the coil into a component term; and (b) determining the physical parameter based upon the component term.

15. A system for measuring the state of charge in an electrochemical battery, the battery having an anode including a first sheet of material, and a cathode including a second sheet of material, the system comprising:

(a) a coil;

(b) holding means for holding the coil adjacent the battery, and in an orientation so that the winding axis of the coil is generally transverse to the surface of at least one of the sheets;

(c) alternating current means electrically connected to the coil, for applying an alternating current at a first frequency to the coil to generate a first oscillatory magnetic field;

(d) magnetic field concentration means for concentrating the first oscillating magnetic field in a direction towards the sheets;

(e) measuring means electrically connected to the coil, for measuring the electrical complex impedance of the coil at the first frequency; and data processing means for receiving the measured electrical complex impedance of the coil; and (f) determining the state of charge of the battery, wherein the data processing means determines the state of charge of the battery by comparing the measured electrical complex impedance of the coil with data correlating state of charge of the battery with electrical complex impedance of the coil.

16. The system of claim 15, wherein the magnetic field concentration means comprises a magnetically permeable core having at least a part of the coil encircled by the core.

17. The system of claim 16, wherein the core includes:

(a) a base;

(b) a nose portion extending from the base; and (c) walls extending from the base a spaced distance from the nose portion, wherein the coil encircles at least a part of the nose portion, and at least a part of the coil is encircled by the walls.

18. The system of claim 15, wherein the magnetic field concentration means includes a backing plate connected to the coil opposite the battery, the backing plate having a magnetically permeable material which is poorly conductive.

19. The system of claim 15, wherein the coil has a maximum diameter no greater than the width of any of the sheets, and no greater than the length of any of the sheets.

20. A system for measuring the state of charge in an electrochemical battery, the battery having an anode including a first sheet of materials, and a cathode including a second sheet of material, the system comprising;

(a) a coil;

(b) holding means for holding the coil adjacent the battery, and in an orientation so that the winding axis of the coil is generally transverse to the surface of at least one of the sheets;

(c) alternating current means electrically connected to the coil for applying an alternating current at a first frequency to the coil to generate a first oscillatory magnetic field;

(d) magnetic field concentration means for concentrating the first oscillating magnetic field in a direction towards the sheets;

(e) measuring means electrically connected to the coil, for measuring the electrical complex impedance of the coil at the first frequency; and (f) data processing means for receiving the measured electrical complex impedance of the coil, and determining the state of charge of the battery, wherein the data processing means determines the state of charge of the battery based upon the electrical complex impedance of the coil by:

(i) reducing the measured complex impedance of the coil into first and second component terms;

(ii) making a first initial determination of the state of charge of the battery based upon the first component term;

(iii) making a second initial determination of the state of charge of the battery based upon the second component term; and (iv) making a final determination of the state of charge of the battery based upon the first and second initial determinations.

21. The system of claim 20, wherein the first component term is the real part of the electrical complex impedance of the coil, and the second component term is the imaginary part of the electrical complex impedance of the coil.

* * * * *